US008227752B1

(12) United States Patent
Mantz et al.

(10) Patent No.: US 8,227,752 B1
(45) Date of Patent: Jul. 24, 2012

(54) METHOD OF OPERATING A SCANNING ELECTRON MICROSCOPE

(75) Inventors: Hubert Mantz, Neu-Ulm (DE); Jaroslaw Paluszynski, Oberkochen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 0 days.

(21) Appl. No.: 13/029,998

(22) Filed: Feb. 17, 2011

(51) Int. Cl.
*H01J 37/28* (2006.01)
*H01J 37/256* (2006.01)

(52) U.S. Cl. ........ 250/306; 250/307; 250/310; 250/311; 250/492.2

(58) Field of Classification Search ................ 250/306, 250/307, 310, 311, 492.2
See application file for complete search history.

(56) References Cited

U.S. PATENT DOCUMENTS

| 5,548,694 | A   | 8/1996  | Frisken-Gibson |         |
|-----------|-----|---------|----------------|---------|
| 6,407,373 | B1  | 6/2002  | Dotan          |         |
| 6,538,249 | B1* | 3/2003  | Takane et al.  | 850/9   |
| 7,642,514 | B2* | 1/2010  | Takane et al.  | 250/310 |
| 7,745,804 | B1  | 6/2010  | Wan            |         |
| 7,904,845 | B2* | 3/2011  | Fouquet et al. | 716/136 |
| 2008/0315120 | A1 | 12/2008 | Albiez      |         |

FOREIGN PATENT DOCUMENTS

| DE | 10 2005 026 022 A1 | 12/2006 |
| EP | 1 061 358 A        | 12/2000 |
| JP | 2008-112596 A      | 5/2008  |
| WO | 2007/090537 A2     | 8/2007  |

OTHER PUBLICATIONS

Q. Pan et al., "Interactive Model Reconstruction with User Guidance", University of Cambridge, Proceeding ISMAR '09 Proceedings of the 2009 8th IEEE International Symposium on Mixed and Augmented Reality, 4 pp.
Q. Pan et al., "Interactive Model Reconstruction with User Guidance", University of Cambridge, Poster, 2009 (http://mi.eng.cam.ac.uk/~qp202/my_papers/ISMAR09/ISMAR09poster.pdf), 1 p.
Q. Pan, "Real-time Interactive 3D Modelling", Machine Intelligence Labs, University of Cambridge, 26 pp.
D. Henrich, "Schnelle Kollisionserkennung durch parallele Abstandsberechnung", 13. Fachgespräch Autonome Mobile Systeme (AMS '97), Stuttgart, 6. + Oct. 7, 1997, Springer-Verlag, Reihe "Informatik Aktuell", pp. 1-12 (with English-language "Statement of Relevance" 1p.).
P. Lindemann, "The Gilbert-Johnson-Keerthi Distance Algorithm", Media Informatics Proseminar, Algorithms in Media Informatics, 2009, pp. 1-4.

(Continued)

*Primary Examiner* — Nikita Wells
(74) *Attorney, Agent, or Firm* — Bruce D. Biter

(57) ABSTRACT

A method of inspecting an object using a scanning particle beam microscope, the method comprising: operating the microscope in a high-resolution mode by laterally scanning a particle beam of the high-resolution mode; operating the microscope in a 3D-mode for acquiring a three-dimensional representation of the object by laterally scanning a particle beam of the 3D-mode; wherein the particle beam of the high-resolution mode and the particle beam of the 3D-mode have a same beam energy and a same focus distance; and wherein an aperture angle of the particle beam of the 3D-mode is at least 2 times greater, or at least 5 times greater, or at least 10 times greater, or at least 100 times greater than an aperture angle of the particle beam of the high-resolution mode.

22 Claims, 7 Drawing Sheets

OTHER PUBLICATIONS

G. Zachmann, "Virtual Reality in Assembly Simulation—Collision Detection, Simulation Algorithms, and Interaction Techniques", Dissertation, Universität Darmstadt, Fraunhofer IRB Verlag, 2001, 231 pp.

T. Moons et al., "3D Reconstruction from Multiple Images: Part 1 Principles", Foundations and Trends in Computer Graphics and Vision, Band 4, 4. Ausgabe, 2009, pp. 287-404.

G. Frankowski et al., "DLP-Based 3D Metrology by Structured Light or Projected Fringe Technology for Life Sciences and Industrial Metrology", Proceedings of SPIE, Photonics West, 2009, pp. 1-12.

Q. Pan et al., "ProFORMA: Probabilistic Feature-based On-line Rapid Model Acquisition", Proceedings "BMVC 2009", British Machine Vision Association, London, 2009 (http://www.bmva.org/bmvc/2009/index.htm), 11 pp.

C. Erikson, "The Gilbert-Johnson-Keerthi (GJK) Algorithm", Sony Computer Entertainment America, 2005 (http://www.google.de/url?sa=t&rct=j&q=Christer+Ericson+Algorithm&source=web&cd=1&ved=0CCgQFjAA&url=http%3A%2F%2Frealtimecollisiondetection.net%2Fpubs%2FSIGGRAPH04_Ericson_the_GJK_algorithm.ppt&ei=lnwmT7rTKYuAwb0213YCA&usg=AFQjCNEOPITYYSC9UCmQwcFPtS8nXWxK2g), 18 pp.

K. Henriksen, "Collision Detection: The GJK Algorithm", Department of Computer Science, University of Copenhagen (http://www.google.de/url?sa=t&rct=j&q=Knud+Henriksen+algorithm&source=web&cd=2&ved=0CDMQFjAB&url=http%3A%2F%2F F140.129.20 .249%2F~jmchen%2Fcompg%2Fslides%2FGJK.pdf&ei=rX0mT8q5LM_sgaqpoTnCA&usg=AFQjCNEzC1C48nEZX1ScWrgvD_uwgEsTcw), 44 pp.

C. Teutsch, "Model-based Analysis and Evaluation of Point Sets from Optical 3D Laser Scanners", Otto-von-Guericke-Universität (Magdeburg), Shaker Verlag, Herzogenrath, 2007, 153 pp.

A. Cvetanovic et al., "Design of a novel visual and control system for the prevention of the collision during the micro handling in a SEM chamber", Microelectronic Engineering, vol. 87, 2010, pp. 139-143.

F. Schmoeckel et al., "Smart Flexible Microrobots for Scanning Electron Microscope (SEM) Applications", Journal of intelligent material systems and structures, vol. 11, 2000, pp. 191-200.

X. Yang et al., "Surface digitization technology based on multi-sensor integration", Proc. of the 5th International Conference on Responsive Manufacturing—Green Manufacturing ICRM, 2010, pp. 57-62.

A. Weckenmann et al., "Multisensor data fusion in dimensional metrology", CIRP Annals—Manufacturing Technology, vol. 58, 2009, pp. 701-721.

Office action in German patent application No. 10 2010 046 902.5 dated Jun. 9, 2011, 6 pp. (with English translation, 5 pp.).

Office action in German patent application No. 10 2010 046 902.5 dated Nov. 9, 2011, 6 pp. (with English translation, 7 pp.).

Search report dated Jan. 25, 2012 in parallel United Kingdom patent application No. GB1116720.2.

* cited by examiner

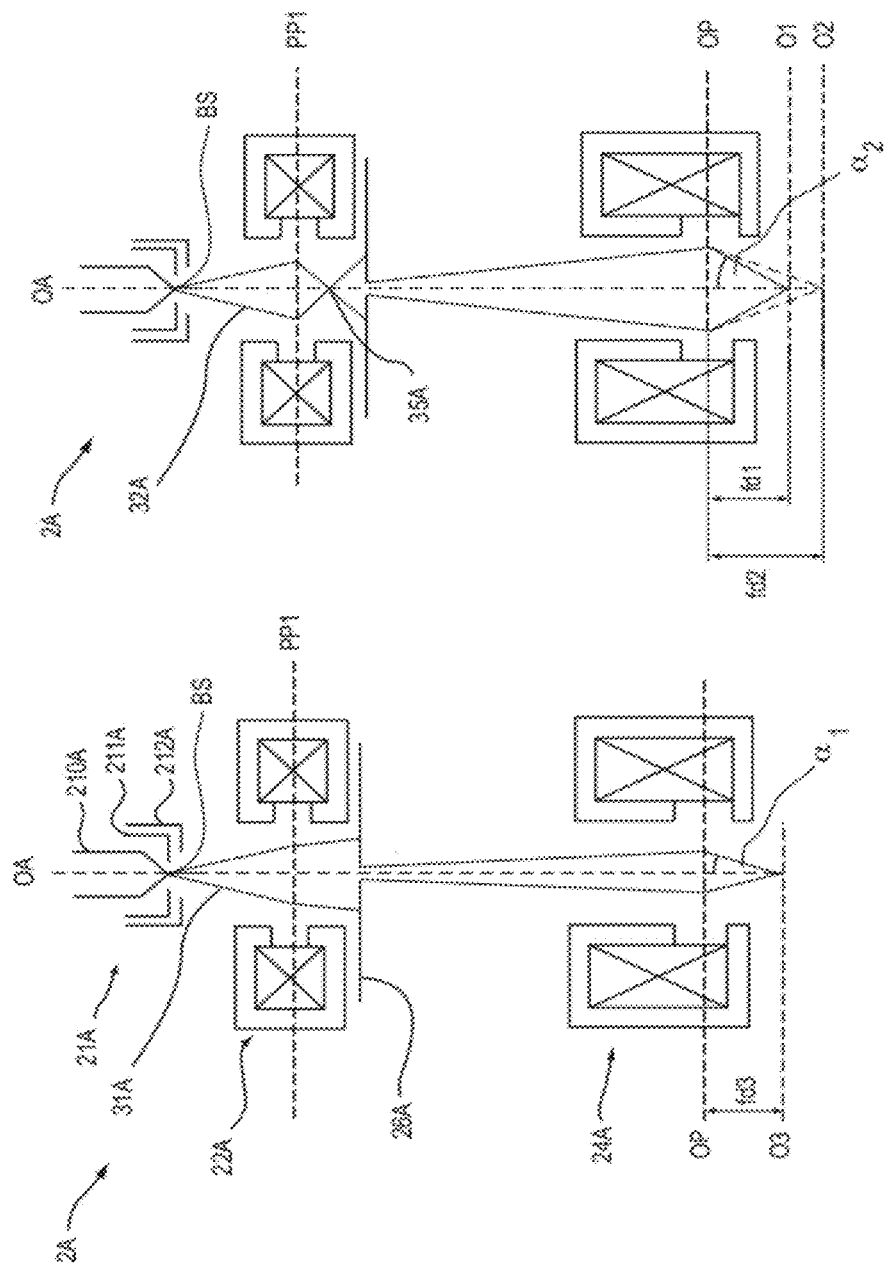

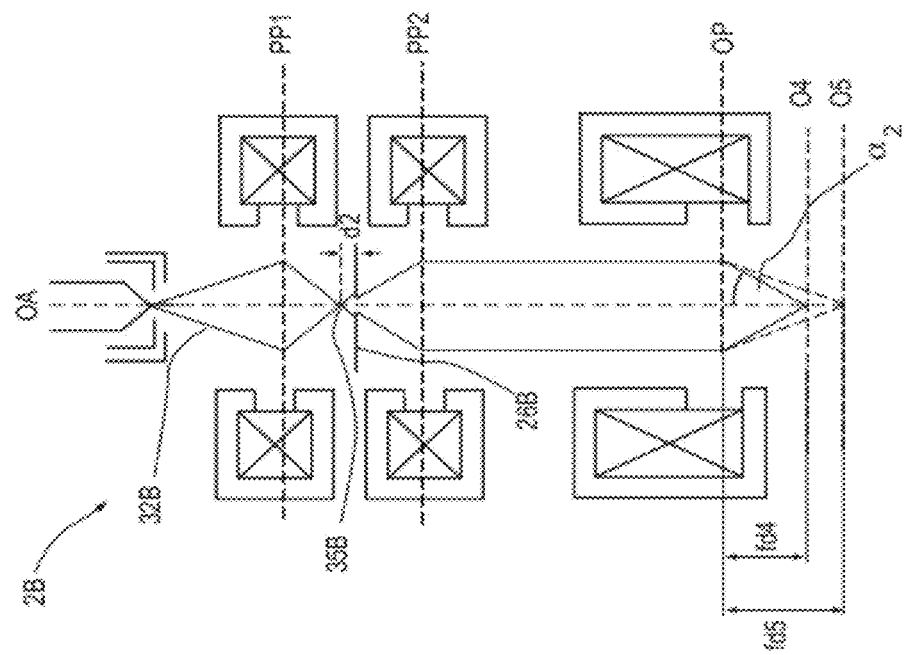
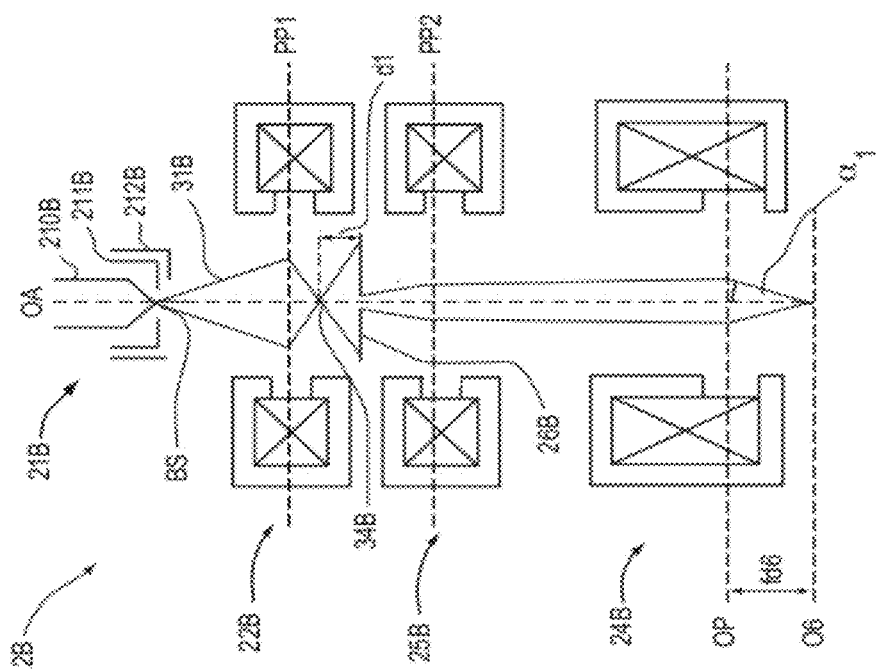
Fig. 3A
Fig. 3B

METHOD OF OPERATING A SCANNING ELECTRON MICROSCOPE

FIELD

The present disclosure relates to a method of operating a scanning particle beam microscope and to a scanning particle microscope having a high-resolution mode and a 3D-mode. In particular, the present disclosure relates to a method and a scanning particle microscope for generating a three-dimensional representation of an object surface under inspection.

BACKGROUND

Particle beam microscopy is a powerful tool for investigating the topography and the chemical composition of object surfaces. Examples of such particle beam microscopes are scanning electron microscopes and helium ion microscopes. They combine high resolution with a wide magnification range. The wide magnification range allows features of an object of different length scales to be investigated. In particular, regions of interest on the object surface may be identified at a low magnification level and later be imaged at a high magnification.

However, in commonly available scanning electron microscopes, it is difficult to reliably determine the exact three-dimensional shape of the object surface solely on the basis of micrographs and without varying the tilt angle of the electron beam with respect to the object surface. As a general rule, the signal height of a secondary electron detector depends on a tilt angle of the surface portion, which is irradiated with the primary electron beam. However, images which have been acquired with a secondary electron detector, also show some atomic number contrast and are influenced by a variety of other effects, such as edge enhancement.

Therefore, typically the three-dimensional topology of the object surface has to be guessed from the image data of the micrograph as it appears on the screen or a printout, often allowing for multiple interpretations.

On the other hand, three-dimensional integrated circuits in which two or more layers of active electronic components are integrated both horizontally and vertically into a single circuit are widely considered to be a promising technology for the future. In order to develop manufacturing technologies for this kind of semiconductor devices, it is advantageous to have reliable and efficient procedures to study the surface topography of objects.

Accordingly, it is considered desirable to provide a method and an apparatus for efficiently inspecting the topography of an object surface by using a scanning particle beam microscope.

SUMMARY

The present invention has been accomplished taking the above problems into consideration.

According to embodiments, there is provided a method of inspecting an object using a scanning particle beam microscope, the method comprising: operating the microscope in a high-resolution mode by laterally scanning a particle beam of the high-resolution mode; operating the microscope in a 3D-mode for acquiring a three-dimensional representation of the object by laterally scanning a particle beam of the 3D-mode; wherein a beam energy of the particle beam of the high-resolution mode is equal to a beam energy of the particle beam of the 3D-mode and wherein a focus distance of the particle beam of the high-resolution mode is equal to a focus distance of the particle beam of the 3D-mode; and wherein an aperture angle of the particle beam of the 3D-mode is at least 2 times greater, or at least 5 times greater, or at least 10 times greater, or at least 100 times greater than an aperture angle of the particle beam of the high-resolution mode.

The particle beam microscope may be a focused ion beam microscope or a scanning electron microscope. For example, the particle beam microscope may be a Helium ion microscope. It is also conceivable that the particle beam microscope comprises an electron beam column and an ion beam column which are configured such that a same object portion can be imaged and/or processed by either column. Such systems are commonly referred to as "cross beam" or "dual beam" systems.

The high-resolution mode may be an operation mode of the microscope in which the microscope is operable to acquire an image of a portion of the object having a higher lateral resolution than in the 3D-mode. The term "lateral resolution" may be defined as the resolution in a plane which is oriented perpendicular to the optical axis. In other words, in the high-resolution mode, the microscope is configured such that a two-dimensional image with a higher lateral resolution than in the 3D-mode is obtainable by scanning the particle beam of the high-resolution mode in a plane which is oriented perpendicular to the optical axis. A focus diameter of the particle beam of the high-resolution mode may be smaller than a focus diameter of the particle beam of the 3D-mode. The focus diameter of the particle beam of the high-resolution mode may be measured at a probe current of equal to or more than $10^{-12}$ A in the object plane.

Operating the microscope in the high-resolution mode may comprise laterally scanning the particle beam of the high-resolution mode in an object plane of the particle beam. The scanning of the high-resolution beam may comprise acquiring a high-resolution image. The high-resolution image may be generated from signals of one or more detectors of the scanning particle beam microscope.

The 3D-mode may be an operation mode of the particle beam microscope in which the microscope is operable to acquire a three-dimensional representation of the object surface by laterally scanning a particle beam of the 3D-mode. The particle beam of the 3D-mode has an aperture angle, which is greater than the aperture angle of the high-resolution mode.

The particle beam of the high-resolution mode and the particle beam of the 3D-mode may be generated by the same particle optical components. In other words, the particle beam of the high-resolution mode and the particle beam of the 3D-mode may traverse the same particle optical components.

The three-dimensional representation may comprise a three-dimensional data set and/or a three-dimensional graphical representation. The graphical representation may be a height profile relative to a reference plane. The reference plane may be oriented perpendicular to a direction representing a direction of an optical axis of the particle optical system.

The focus distance of a particle beam may be defined as the distance between the focus of the particle beam in the object plane and a principal plane of the objective lens. In case the objective lens has more than one principal planes, the focus distance may be measured between the focus of the particle beam in the object plane and the principal plane of the objective lens, which is located closest to the focus.

The beam energy of the particle beam may be defined as the acceleration voltage of the particle beam. The beam energy may vary along the beam path between the particle beam gun and the object plane. For example, in case the particle beam microscope is a scanning electron microscope, the electron optical system may comprise a beam booster, which is configured to maintain a beam energy, for example in the 10 kV range, along a portion of the beam path. In this case, the beam energy of the particle beam of the high-resolution mode and the beam energy of the 3D-mode may be generated with the same acceleration voltages of the particle optical system. In other words, for each position of the particle beam along the optical axis, the particles of the particle beam of the high-resolution mode may have the same energy as the particles of the particle beam of the 3D-mode.

The aperture angle may be defined as the maximum angle at which beam rays of a beam path of the particle beam converge at the object plane with respect to the optical axis of the particle optical system. In other words, the beam rays of a particle beam of the scanning particle microscope form a cone having an opening angle of twice the aperture angle of the particle beam. A greater aperture angle of a particle beam of the 3D-mode compared to the particle beam of the high-resolution mode reduces the depth of focus of the particle beam of the 3D-mode compared to the particle beam of the high-resolution mode. A reduced depth of focus of the particle beam of the 3D-mode may allow a higher resolution along the optical axis of the three-dimensional representation.

Accordingly, it is possible to acquire from an object under inspection an image having a high lateral resolution and also a three-dimensional representation having a high resolution along the optical axis. Thereby, an efficient and more thorough inspection of an object surface is possible. Moreover, since a focus distance and a beam energy of the particle beam of the high-resolution mode correspond to a focus distance and a beam energy of the particle beam of the 3D-mode, the microscope can be readily switched between both modes to exactly image the same object portion with both modes. This allows to accurately combine data acquired in the high-resolution mode with data acquired in the 3D-mode.

According to an embodiment the aperture angle of the particle beam of the 3D-mode is greater than 2 mrad, or greater than 5 mrad, or greater than 10 mrad, or greater than 100 mrad.

Accordingly, it is possible to acquire a three-dimensional representation in the 3D-mode having a high resolution along the optical axis of the scanning particle beam microscope.

According to an embodiment, the aperture angle of the particle beam of the 3D-mode is less than 1,000 mrad or less than 500 mrad or less than 200 mrad or less than 100 mrad.

According to a further embodiment, a focus diameter of the particle beam of the high-resolution mode in an object plane of the particle beam of the high-resolution mode is less than 5 nanometers, or less than 3 nanometers, or less than 2 nanometers.

The focus diameter may be measured in a direction which is oriented perpendicular to the optical axis of the particle optical system. The focus diameter may be defined as the largest diameter of the disk of least confusion. The focus diameter may be the diameter of a circle in the object plane, wherein the circle contains 50% of a total current of the particle beam of the high-resolution mode. The focus diameter is a measure for the resolution of the charged particle microscope. The focus diameter may be determined at a beam current in the object plane of equal to or more than $10^{-12}$ A.

According to a further embodiment, an object plane of the particle beam of the high-resolution mode is the only plane of the particle beam of the high-resolution mode which is located downstream of a particle beam source and which is optically conjugate to the particle beam source.

In other words, the particle beam of the high-resolution mode is free of a cross-over in the beam path between the particle beam source and the object plane.

The particle beam source may be an emission tip or a cross-over generated by a particle gun of the particle beam microscope. Thereby, the particle beam source may be a virtual particle beam source. In case the particle gun is configured to generate a plurality of cross-overs, the particle beam source may be defined as the cross-over, which is located most downstream of an emission tip of the particle gun.

Accordingly this allows to prevent electrons of the electron beam of the high-resolution mode from interacting with each other to produce the so-called Boersch effect. The Boersch effect leads to an increased energy spread of the electrons. An increased energy spread leads to a lower resolution. Furthermore, an electron beam without a cross-over allows to design a shorter electron optical system, which reduces stochastic electron-electron interactions.

According to a further embodiment, the laterally scanning of the particle beam of the 3D-mode comprises laterally scanning the particle beam of the 3D-mode at each of a plurality of focus distances of the 3D-mode; wherein the plurality of focus distances comprise the focus distance of the particle beam of the 3D-mode which is equal to the focus distance of the particle beam of the high-resolution mode.

The focus distance may be adjusted by adjusting an excitation of the objective lens. For example, for generating a particle beam having a shorter focus distance, the objective lens may be more strongly excited than for generating a particle beam having a longer focus distance. For each focus distance of the plurality of focus distances, the aperture angle of the particle beam of the 3D-mode may be least 2 times greater, or at least 5 times greater, or at least 10 times greater, or at least 100 times greater than the aperture angle of the particle beam of the high-resolution mode.

A number of the plurality of different focus distances may be at least 5, at least 10, at least 50, or at least 100.

According to a further embodiment, the method further comprises: acquiring a plurality of images, which corresponds to the lateral scanning at the plurality of focus distances; determining from the plurality of images a plurality of stacks of image regions, such that image regions which are part of a same stack of the plurality of stacks show a same object portion; and determining for each stack of the plurality of stacks an in-focus region from the image regions of the respective stack.

By scanning the particle beam of the 3D-mode at a focus distance of the plurality of focus distances, a particle microscopic image may be acquired. Accordingly, by laterally scanning the particle beam of the 3D-mode at a plurality of focus distances, a plurality of images may be acquired. Each of the plurality of images may correspond to one focus distance of the plurality of focus distances. Different images may correspond to different focus distances. Each of the plurality of images may show the same or substantially the same portion of the object. In case the particle beam microscope is a scanning electron microscope, the plurality of images may for example be acquired by using one or a combination of the following detectors: a chamber-mounted secondary electron detector, an in-lens secondary electron detector, an in-lens backscattered electron detector, and a chamber-mounted backscattered electron detector. The chamber-mounted backscattered electron detector may be mounted upstream of the object region, such that it surrounds an exit opening of the electron optical system.

Each of the image regions may represent a portion of one of the plurality of images. Hence, in each image of the plurality of images, a set of image regions is determined. The image regions in an image may be adjacent or overlapping. They may cover the whole or substantially the whole image.

Each of the image regions may be, for example, a single pixel or a group of pixels. The group of pixels may represent a square or a rectangle of the image. For example, an image region may be a square of 8 times 8 pixels. Each of the regions may have the same size. It is also conceivable that image regions, which correspond to a same image, have different sizes and/or shapes. The size and/or shape of a region may depend on image data values within the respective region and/or image data surrounding the respective region.

A stack consists of image regions, which show a same or substantially a same portion of the object. For each of the stacks, the image regions are analyzed to determine the image region of the respective stack, which is most focused. The region, which is most focused is referred to herein as the in-focus region of the respective stack. The in-focus region may be determined depending on a comparison between the image regions of a stack.

The scanning particle microscope may comprise a computer, which is configured to perform the analysis of the image regions and the determining of the in-focus region.

The in-focus region may be determined by applying an image processing routine to each of the regions of the respective stack. The image processing routine may comprise an edge detection routine. Additionally or alternatively, the image processing routine may comprise a high-pass filter. After applying one or more image processing routines, the regions may be sorted by mean amplitude to determine the in-focus region.

Additionally or alternatively, the in-focus region is determined depending on image data values outside the image regions of the stack. For example, the determining of the in-focus image region may comprise analyzing neighboring pixels of the image regions or analyzing pixels, which are located within a predetermined distance from the image regions.

The determined in-focus region represents an x- and y-position in the object plane. Furthermore, the in-focus region corresponds to a focus distance, which is the focus distance of the image, which comprises the in-focus region. The x-positions, the y-positions and the focus distances of the determined in-focus regions of the plurality of stacks may represent the three-dimensional representation.

According to an embodiment, the method further comprises: determining data values depending on signals generated by a detector of the scanning particle beam microscope; and determining for each of the data values a location relative to the three-dimensional representation wherein the location corresponds to an object portion at which the respective data value has been measured.

The determined data values may be pixel data values of an image. The image may be acquired by scanning the particle beam of the high-resolution mode and/or the particle beam of the 3D-mode.

The location relative to the three-dimensional representation may be a point having coordinates in a coordinate system defined by the three-dimensional representation. The point may indicate the location on the three-dimensional representation, which corresponds to the pixel data value. For example, the three-dimensional representation may comprise a height profile and the location is a point on a surface of the height profile.

From the determined locations relative to the three-dimensional representation and the corresponding data values, a height profile may be generated onto which the data values are projected. The height profile may be a graphical three-dimensional representation, which indicates heights of the object surface relative to a reference plane. The reference plane may be oriented perpendicular to a direction, which indicates a direction of the optical axis.

The image data values may be image data values which depend more on compositional contrast (i.e. atomic number contrast) than on surface topography. For example, the image data values are generated by using a backscattered electron detector.

The scanning particle beam microscope may comprise a computer which is configured to determine the data values and to determine for each of the data values the location relative to the three-dimensional representation.

Accordingly, a representation of the object surface is obtained, which represents surface topography through the three-dimensional representation, as well as compositional contrast through the projected image data values.

The detector which generates the signals from which the data values are determined may be different from the detector, which is used for acquiring the three-dimensional representation. The detector may be configured to detect secondary and/or backscattered electrons. Additionally or alternatively, the detector may be configured to detect secondary ions. Additionally or alternatively, the detector may be an EDX spectrometer and/or a WDS spectrometer. Additionally or alternatively, the detector may be a electron backscatter diffraction detector (EBSD detector).

According to an embodiment, the data values are generated by scanning the particle beam of the high-resolution mode in the object plane of the particle beam of the high-resolution mode.

Accordingly, since a focus distance and a beam energy of the particle beam of the high-resolution mode is equal to a focus distance and a beam energy of the particle beam of the 3D-mode, it is possible to accurately determine for each of the data values a location relative to the three-dimensional representation.

Hence, an efficient method of generating an accurate representation is obtained, which visualizes surface topography and compositional contrast of the object surface.

Additionally or alternatively, the data values are generated by laterally scanning the particle beam of the 3D-mode. Additionally or alternatively, the image data values are generated by laterally scanning a particle beam of an operation mode which is different from the high-resolution mode and the 3D-mode.

According to an embodiment, the data values are projected onto a height profile of the three-dimensional representation along a direction, wherein the direction represents a direction of the optical axis. Thereby, each of the pixel data values is projected onto its corresponding location on the height profile.

According to an embodiment, the method further comprises: storing the three-dimensional representation; and storing a position of a measurement location relative to the three-dimensional representation.

A measurement location may be a portion of the object which has been scanned by a particle beam of the microscope to acquire an image. The measurement location may correspond to a measurement, which is different from the scanning of the laterally scanning of the particle beam of the 3D mode for acquiring the three-dimensional representation. For example, the measurement location may be a location at which an image in the high-resolution mode has been acquired. The measurement location may be a location at which an image has been acquired in a mode different from the 3D mode. It is also conceivable that the measurement location is a location, where an EDX spectrum and/or a WDS spectrum has been acquired.

More than one, in particular a plurality of measurement locations may be stored relative to the three-dimensional representation.

Accordingly, it is possible for the user to readily see, which portions of an object surface have already been inspected. Furthermore, this allows to find again the measurement location, for example in case the object has been moved relative to the particle optical system or in case the object has been removed from the microscope and has been inserted again for further inspection.

According to an embodiment, the method further comprises: acquiring a second three-dimensional representation of the object by the operating of the microscope in the 3D-mode; and comparing the second three-dimensional representation with the stored three-dimensional representation to determine a position of the measurement location relative to a scanning region of the microscope.

The second three-dimensional representation may correspond to an object portion, which is at least partly identical to an object portion, which corresponds to the stored three-dimensional representation.

Comparing the second three-dimensional representation with the stored three-dimensional representation may comprise identifying portions of the stored three-dimensional representation and the second three-dimensional representation, which correspond to a same portion of the object. By way of example, the stored three-dimensional representation and the second three-dimensional representation may be compared by displacing the stored three-dimensional representation relative to the second three-dimensional representation until a deviation between the stored three-dimensional representation and the second three-dimensional representation is minimized.

The scanning region of the microscope may be a spatial region, which is imageable with the scanning particle microscope. In other words, the scanning particle microscope may be configured to provide one or more particle beams, wherein the object planes of these particle beams comprise the scanning region.

Accordingly, it is possible to find again and to image the stored measurement location at a later time. For example, the object may have been removed from the microscope for chemically processing the object surface. After again inserting the object into the microscope, the second three-dimensional representation is acquired. Through a comparison of the second three-dimensional representation with the stored three-dimensional representation, it is possible to find again the stored measurement location for inspecting the difference in the chemical composition of the object surface before and after the chemical process.

According to embodiments, a method of acquiring a three-dimensional representation of an object by operating a scanning particle beam microscope in a 3D-mode is provided; wherein in the 3D-mode, an aperture angle of a particle beam of the 3D-mode, which is directed to the object, is at least 2 times greater, or at least 5 times greater, or at least 10 times greater, or at least 100 times greater than an aperture angle of a particle beam of a high-resolution mode of the microscope; and wherein a beam energy of the particle beam of the high-resolution mode is equal to a beam energy of the particle beam of the 3D-mode, and wherein a focus distance of the particle beam of the high-resolution mode is equal to a focus distance of the particle beam of the 3D-mode.

According to embodiments, a scanning particle beam microscope having a particle optical system is provided, wherein the particle optical system is configured to be operable in a high-resolution mode by laterally scanning a particle beam of the high-resolution mode; wherein the particle beam microscope is further configured to be operable in a 3D-mode for acquiring a three-dimensional representation of an object by laterally scanning a particle beam of the 3D-mode; wherein a beam energy of the particle beam of the high-resolution mode is equal to a beam energy of the particle beam of the 3D-mode and wherein a focus distance of the particle beam of the high-resolution mode is equal to a focus distance of the particle beam of the 3D-mode; and wherein an aperture angle of the particle beam of the 3D-mode is at least 2 times greater, or at least 5 times greater, or at least 10 times greater, or at least 100 times greater than an aperture angle of the particle beam of the high-resolution mode.

According to an embodiment, the particle optical system further comprises: a first magnetic condenser lens having a principal plane; and an objective lens having a principal plane.

According to an embodiment, the particle optical system is configured such that an excitation of the first magnetic condenser lens in the 3D-mode is higher than an excitation of the first magnetic condenser lens in the high-resolution mode.

For example, an excitation current of the first magnetic condenser lens in the 3D-mode may be higher than an excitation current of the first magnetic lens in the high-resolution mode.

According to an embodiment, the particle optical system is configured such that the particle beam of the 3D-mode comprises a cross-over on the beam path between the principal plane of the first magnetic condenser lens and the principal plane of the objective lens.

The cross over of the particle beam of the 3D-mode may be located between the principal plane of the first magnetic condenser lens and an aperture stop, which is arranged between the principal plane of the first magnetic condenser lens and the principal plane of the objective lens in the beam path. Alternatively, the cross-over of the particle beam of the 3D-mode may be located between the aperture stop and the principal plane of the objective lens.

According to an embodiment, the particle optical system is configured such that the particle beam of the high-resolution mode comprises a cross-over on the beam path between the principal plane of the first magnetic condenser lens and the principal plane of the objective lens; wherein the particle optical system comprises an aperture stop arranged between the principal plane of the first magnetic condenser lens and the principal plane of the objective lens in the beam path; and wherein a distance along the optical axis between the aperture stop and the cross-over of the particle beam of the high-resolution mode is greater than a distance along the optical axis between the aperture stop and the cross-over of the particle beam of the 3D-mode.

The cross over of the particle beam of the 3D-mode may be located between the principal plane of the first magnetic condenser lens and the aperture stop. Alternatively, the cross-over of the particle beam of the 3D-mode may be located between the aperture stop and the principal plane of the objective lens. The cross over of the particle beam of the high-resolution mode may be located between the principal plane of the first magnetic condenser lens and the aperture stop. Alternatively, the cross-over of the particle beam of the high-resolution mode may be located between the aperture stop and the principal plane of the objective lens.

According to an embodiment, the particle optical system further comprises a second magnetic condenser lens which is arranged between the first magnetic condenser lens and the objective lens in the beam path; wherein an excitation of the first magnetic condenser lens in the 3D-mode is lower than an excitation of the first magnetic condenser lens in the high-resolution mode; and wherein an excitation of the second magnetic condenser lens in the 3D-mode is higher than an excitation of the second magnetic condenser lens in the high-resolution mode.

For example, an excitation current of the second magnetic condenser lens in the 3D-mode may be higher than an excitation current of the second magnetic condenser lens in the high-resolution mode. An excitation current of the first magnetic condenser lens in the 3D-mode may be lower than an excitation current of the first magnetic condenser lens in the high-resolution mode.

According to an embodiment, the aperture stop is configured to provide a plurality of different aperture diameters at a position in the beam path; wherein an aperture diameter for the particle beam of the high-resolution mode is smaller than an aperture diameter for the particle beam of the 3D-mode.

The aperture stop may be configured as a multi hole diaphragm, comprising apertures of different diameters. The particle optical system may comprise deflectors, which are excitable such that the particle beam is guided through one of the different apertures of the multi-hole diaphragm.

Additionally or alternatively, the aperture stop may comprise one or more plate-like movable members. The plate-like movable members are for example made of metal and are arranged in the beam path such as to form an aperture. The plate-like movable members may be attached to actuators. The actuators and the plate-like movable members may be configured such that upon actuation of the actuators, the plate-like movable members are movable in a direction perpendicular to the optical axis such that the aperture diameter is varied.

BRIEF DESCRIPTION OF THE DRAWINGS

The foregoing as well as other advantageous features of this disclosure will be more apparent from the following detailed description of exemplary embodiments of the present disclosure with reference to the accompanying drawings. It is noted that not all possible embodiments of the present invention necessarily exhibit each and every, or any, of the advantages identified herein.

FIG. 2A schematically illustrates a first exemplary embodiment of a particle optical system of the scanning particle beam microscope, as illustrated in FIG. 1, wherein the particle optical system is in the high-resolution mode;

FIG. 2B schematically illustrates the particle optical system of FIG. 2A in the 3D-mode;

FIG. 3A schematically illustrates a second exemplary embodiment of a particle optical system of a scanning particle beam microscope, as illustrated in FIG. 1, wherein the particle optical system is in the high-resolution mode;

FIG. 3B schematically illustrates the particle optical system of FIG. 3A in the 3D-mode;

DETAILED DESCRIPTION OF EXEMPLARY EMBODIMENTS

Figure 1:
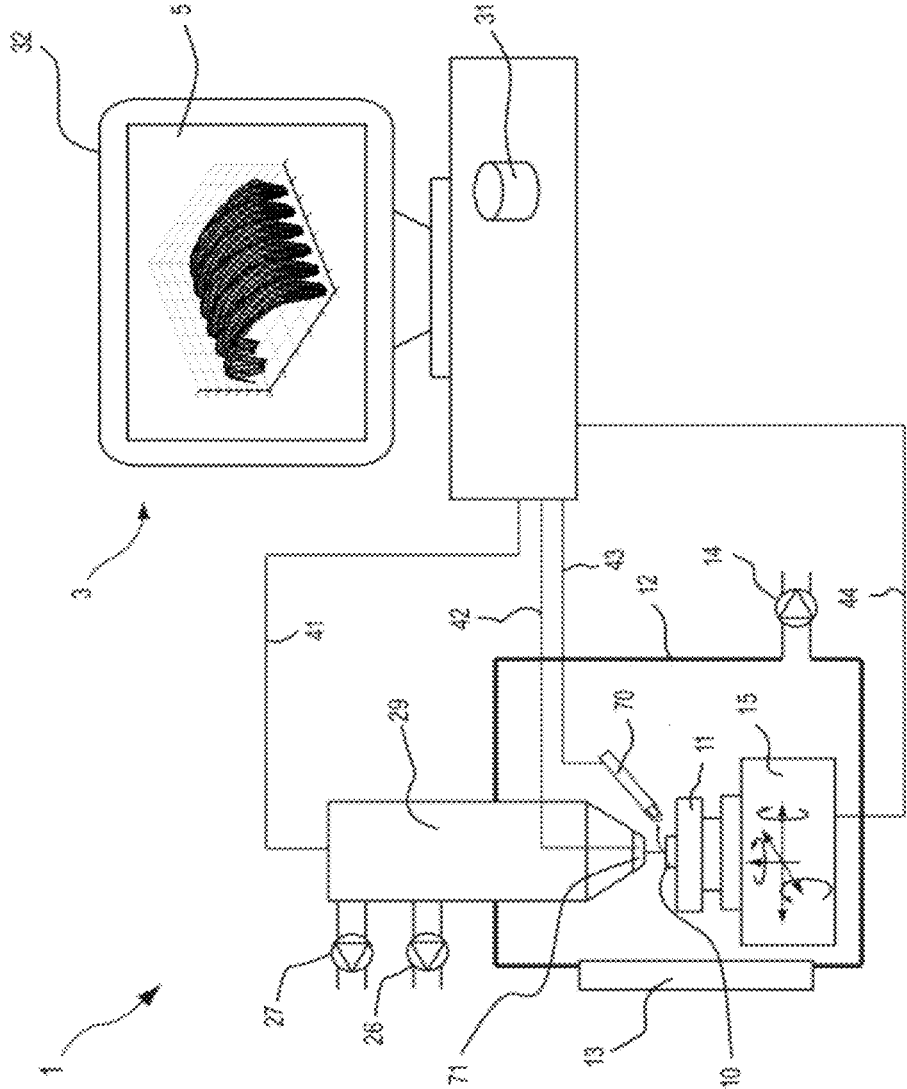
FIG. 1 schematically illustrates a scanning particle beam microscope according to an exemplary embodiment.

FIG. 1 shows a schematic illustration of a scanning electron microscope 1 according to an exemplary embodiment. The scanning electron microscope 1 comprises a measurement vacuum chamber 12 in which an object 10 is disposed during measurement. The measurement vacuum chamber 12 is connected to a first vacuum pumping system 14, which is configured to evacuate an interior of the measurement vacuum chamber 12 and to maintain it at a vacuum level required for performing measurements.

The scanning electron microscope 1 further comprises an electron optical system (not shown in FIG. 1), which is housed in a microscope column 29. A second vacuum pumping system 26 and a third vacuum pumping system 27 are connected to the microscope column 29. The measurement vacuum chamber 12 comprises a door 13, which is configured such that the object 10 is insertable into an interior of the measurement vacuum chamber 12. The scanning electron microscope 1 further comprises an object holder 11, which is attached to a positioning system 15 of the scanning electron microscope 1. The object holder 11 is designed such that the object 10 is attachable to a surface of the object holder 11. The positioning system 15 is designed such that the object 10, which is attached to the object holder 11, is positionable in an object plane of an electron beam generated by the electron optical system.

The scanning electron microscope 1 further comprises a chamber-mounted secondary electron detector 70 and a backscattered electron detector 71. The backscattered electron detector 71 is mounted upstream of the object plane and surrounds an exit opening of the electron optical system. It is also conceivable that the scanning electron microscope 1 comprises further detectors like one or a combination of an in-lens secondary electron detector, an in-lens backscattered electron detector, a secondary ion mass spectrometer (SIMS detector), an electron backscatter diffraction detector (EBSD detector), an EDX spectrometer, a WDS spectrometer and a detector for scanning transmission electron microscopy (STEM detector).

The scanning electron microscope 1 further comprises a computer 3. The computer 3 receives signals from and transmits signals to each of the detectors of the scanning electron microscope 1. As shown in FIG. 1, the computer 3 is in signal communication with the chamber-mounted secondary electron detector 70 via signal line 43 and further with the backscattered electron detector 71 via signal line 42. The computer 3 is configured to receive signals from the detectors and to generate from the received signals three-dimensional representations and two-dimensional images of the surface of the object 10. The computer 3 further comprises a display 32 and a computer storage medium 31. The computer storage medium 31 may for example be a hard disk drive. The computer 3 is configured to store data values of acquired images and three-dimensional representations in the computer storage medium 31. The computer 3 is further configured to display images and height profiles 5 of the three-dimensional representations on the display 32.

The computer 3 is further in signal communication with the electron optical system via signal line 41. The computer 3 is configured to transmit via signal line 41 control signals to set an operation mode selected from a plurality of operation modes of the scanning electron microscope 1. The plurality of operation modes of the scanning electron microscope 1 comprises a high-resolution mode and a 3D-mode. In the high-resolution mode, the electron optical system is configured to generate an electron beam having a focus diameter of less than 5 nanometers or of less than 3 nanometers or less than 2 nanometers. In the 3D-mode, the scanning electron microscope is configured to acquire a three-dimensional representation of the surface of the object 10.

FIGS. 2A and 2B schematically illustrate a first exemplary embodiment of an electron optical system 2A. The electron optical system is arranged in the microscope column 29 of the scanning electron microscope 1, which has been described with reference to FIG. 1. FIG. 2A shows the electron optical system 2A in the high-resolution mode and FIG. 2B shows the electron optical system 2A in the 3D-mode.

The electron beam 31A of the high-resolution mode may be defined as an electron beam having a focus diameter in the object plane O3 of the electron beam 31A of less than 5 nanometers or less than 3 nanometers or less than 2 nanometers.

The electron optical system 2A comprises an electron gun 21A. The electron gun 21A comprises a cathode 210A, a first electrode 211A and a second electrode 212A. The electron gun 21A may for example be configured as a thermionic electron gun or a field emission electron gun. The electron beam 31A, which is generated by the electron gun 21A is directed by the particle optical system 2A towards the object 10. The electron gun 21A comprises an electron beam source BS, which may be located at an emission tip of the cathode 210A or at a cross-over of the electron beam 31A generated by the electron gun 21A.

The electron optical system 2A further comprises a first magnetic condenser lens 22A, which is arranged downstream of the electron gun 21A in the beam path and an objective lens 24A, which is arranged downstream of the first magnetic condenser lens 22A in the beam path. The electron optical system 2A further comprises an aperture stop 26A, which is located downstream of a principal plane PP1 of the first magnetic condenser lens 22A and upstream of a principal plane OP of the objective lens 24A. The aperture stop 26A is configured to provide a plurality of different aperture diameters at a position in the beam path. For example, the aperture stop 26A may comprise a disc having a plurality of apertures which are arranged side by side, wherein each of the apertures has a different aperture diameter. In other words, the aperture stop may be configured as a multi hole diaphragm. The particle optical system 2A may comprise deflectors which are excitable such that the electron beam 31A is guided through one of the apertures. Thereby, an aperture diameter of the aperture stop 26A may be selected. It is also conceivable that the aperture stop 26A comprises one or more plate-like movable members. The plate-like movable members are for example made of metal and are arranged in the beam path such as to form an aperture. The plate-like movable members are attached to actuators. The actuators and the plate-like movable members are configured such that upon actuation of the actuators, the plate-like movable members move in a direction perpendicular to the optical axis such that the aperture diameter is varied.

Though not shown in the present drawings, the electron optical system 2A may further comprise deflectors for scanning the electron beam in the object plane O3. Moreover, the electron optical system 2A may comprise a liner tube, also known as beam booster, which may be configured to maintain a beam energy, for example in the 10 kV range, throughout a portion of the beam path. The objective lens 24A may be configured such that in a gap in a final end portion of a polepiece of the objective lens, the primary electrons are retarded such that they assume a selected landing energy. The landing energy is the energy of the electrons when being incident on the object surface. The objective lens 24A may comprise a magnetic lens and an electrostatic lens. In other words, the objective lens may be configured as a compound magnetic/electrostatic objective lens. It is also conceivable that the objective lens 24A is configured as a magnetic lens, i.e. without an electrostatic lens.

In the high-resolution mode, as shown in FIG. 2A, downstream of the electron beam source BS, there is exactly one plane which is perpendicular to the optical axis and which is optically conjugate to the electron beam source. This plane is the object plane O3 of the particle optical system 2A which is downstream of the objective lens 24A. In other words, the electron beam 31A of the high-resolution mode does not have a cross-over along the beam path between the electron beam source BS and the object plane O3.

Thereby, it is prevented that electrons of the electron beam 31A of the high-resolution mode interact with each other to produce the so-called Boersch effect, which would lead to an increased energy spread of the electrons. An increased energy spread would degrade the resolution. Furthermore, an electron beam without a cross-over allows to design a shorter electron optical system 2A, which reduces stochastic electron-electron interactions.

The electron beam 31A of the high-resolution mode may be configured such that it has a focus diameter in the object plane O3 of less than 5 nanometers or less than 3 nanometers or less than 2 nanometers. This is in particular achieved by an aperture angle $\alpha_1$ of the high-resolution electron beam which is selected such that a focus diameter of the electron beam 31A in the object plane O3 of the electron beam 31A is small compared to a focus diameter of the electron beam of the 3D-mode.

FIG. 2B schematically shows the electron optical system 2A in the 3D-mode. In the 3D-mode, the electron optical system 2A is configured to laterally scan an electron beam 32A of the 3D-mode at each of a plurality of focus distances fd1, fd2. Thereby, a focus of the electron beam 32A of the 3D-mode is scanned in each of a plurality of object planes O1, O2. In FIG. 2B, there are shown two focus distances fd1, fd2. However, it is conceivable that the electron beam of the 3D-mode is laterally scanned at more than 2, for example more than 10, or more than 50, or more than 100, or more than 1,000 different focus distances. In the 3D-mode, the electron optical system 2A may be configured to select between the plurality of focus distances fd1, fd2 in particular by adjusting the excitation of the objective lens 24A.

By scanning an object surface at each of the plurality of focus distances fd1, fd2, it is possible to acquire a three-dimensional representation of the object surface.

A focus distance fd1 of the plurality of focus distances fd1, fd2 is equal to a focus distance fd3 of the particle beam 31A of the high-resolution mode. Moreover, a beam energy of the particle beam 32A of the 3D-mode is equal to a beam energy of the particle beam 31A of the high-resolution mode.

Accordingly, the particle optical system may be configured to be readily switchable between the high-resolution mode and the 3D-mode such that the same image portion is scannable by the electron beams in the high-resolution mode and in the 3D-mode. Thereby, it is possible to determine for each pixel data value of an image, which has been acquired in the high-resolution mode, a location relative to the three-dimensional representation, wherein the location corresponds to the object portion at which the respective pixel data value has been measured. In other words, this allows to combine image data, acquired in the high-resolution mode with the three-dimensional representation acquired in the 3D-mode. Hence, the three-dimensional representation having a high resolution along the optical axis may be combined with image data having a high lateral resolution (i.e. perpendicular to the optical axis).

In the 3D-mode, the first magnetic condenser lens 22A is more strongly excited than in the high-resolution mode. Additionally, an aperture diameter of the aperture stop 26A in the 3D-mode may be greater than an aperture diameter in the high-resolution mode. The electron beam 32A of the 3D-mode comprises a cross-over 35A on the beam path between the principal plane PP1 of the first condenser lens 22A and the principal plane OP of the objective lens 24A; wherein the electron beam 31A of the high-resolution mode is free of a cross-over between the principal plane PP1 of the first magnetic condenser lens 22A and the principal plane OP of the objective lens 24A. The cross-over 35A of the electron beam 32A of the 3D-mode may be located on the beam path between the principal plane PP1 of the first magnetic condenser lens 22A and the aperture stop 26A. Alternatively, the cross-over 35A of the electron beam 32A of the 3D-mode may be located on the beam path between the aperture stop 26A and the principal plane OP of the objective lens 24A.

The electron beam 32A of the 3D-mode has an aperture angle $\alpha_2$, which is least 2 times greater, or at least 5 times greater, or at least 10 times greater, or at least 100 times greater than the aperture angle $\alpha_1$ of the electron beam 31A of the high-resolution mode. In the particle optical system 2A, the aperture angle $\alpha_1$ of the electron beam 31A of the high-resolution mode and the aperture angle $\alpha_2$ of the electron beam 32A of the 3D-mode are adjusted by one or a combination of the excitation of the first magnetic condenser lens 22A, the aperture diameter of the aperture stop 26A, the excitation of the objective lens 24A the voltage setting of the first electrode 211A and the voltage setting of the second electrode 212A.

Thereby, a short depth of focus in the object region, is achieved for the electron beam 32A of the 3D-mode, which in turn allows to acquire a three-dimensional representation of the object surface having a high resolution along an optical axis OA of the electron optical system 2A.

The computer 3, as shown in FIG. 1, is configured to control one or a combination of the following for switching the particle optical system 2A between the high-resolution mode and the 3D-mode: the excitation of the first magnetic condenser lens 22A, the excitation of the objective lens 24A, the aperture diameter of the aperture stop 26A, the voltage setting of the first electrode 210A and the voltage setting of the second electrode 211A. The computer 3 may further be configured to control further parameters when switching between the high-resolution mode and the 3D-mode such as a voltage setting of the liner tube.

FIGS. 3A and 3B show a schematic illustration of an electron optical system 2B according to a second exemplary embodiment. The electron optical system 2B may be arranged in the microscope column 29 of the scanning electron microscope 1 as shown in FIG. 1. The electron optical system 2B comprises components corresponding to the electron optical system 2A, as shown in FIGS. 2A and 2B and which are therefore provided with corresponding reference signs. The electron optical system 2B further comprises a second magnetic condenser lens 25B, which is arranged downstream of the aperture stop 26B and upstream of the objective lens 24B in the beam path.

FIG. 3A illustrates the electron optical system 2B in the high-resolution mode. An electron beam 31B of the high-resolution mode comprises a cross-over 34B along the beam path between the principal plane PP1 of the first magnetic condenser lens 22B and the principal plane PP2 of the second magnetic condenser lens 25B.

FIG. 3B illustrates the electron optical system 2B in the 3D-mode. Also in the 3D-mode of the electron optical system 2B, the electron optical system 2B is configured to laterally scan the electron beam 32B at each of a plurality of focus distances fd4, fd5. Thereby, the electron beam 32B is scanned in a plurality of object planes O4, O5. An aperture angle $\alpha_2$ of the electron beam 32B of the 3D-mode is at least 2 times greater, or at least 5 times greater, or at least 10 times greater, or at least 100 times greater than an aperture angle $\alpha_1$ of the electron beam of the high-resolution mode 31B.

A focus distance fd4 of the plurality of focus distances fd4, fd5 is equal to a focus distance fd6 of the particle beam 31B of the high-resolution mode. The focus distance fd6 corresponds to an object plane O6. Moreover, a beam energy of the particle beam 32B of the 3D-mode is equal to a beam energy of the particle beam 31B of the high-resolution mode.

The objective lens 24B may comprise a magnetic lens and an electrostatic lens. In other words, the objective lens may be configured as a compound magnetic/electrostatic objective lens. It is also conceivable that the objective lens 24B is configured as a magnetic lens, i.e. without an electrostatic lens.

For each lens of the lenses of the particle optical systems 2A and 2B, it is conceivable that it is an electrostatic lenses, magnetic lenses or a combination of an electrostatic lens and a magnetic lens.

In the 3D-mode of the particle optical system 2B, the first magnetic condenser lens 22B is less strongly excited than in the high-resolution mode. Furthermore, in the 3D-mode, the second magnetic condenser lens 25B is more strongly excited than in the high-resolution mode. Furthermore, in the 3D-mode of the particle optical system 2B, the second magnetic condenser lens 25B may be excited such that the electron beam 32B between the principal plane PP2 of the second magnetic condenser lens 25B and the principal plane OP of the objective lens 24B is divergent or parallel.

The electron beam of the 3D-mode 32B comprises a cross-over 35B on the beam path. A distance d2 between the cross-over 35B of the electron beam 32B of the 3D-mode and the aperture stop 26B measured along the optical axis OA is shorter than a distance d1 between the cross-over 34B of the electron beam 31B of the high-resolution mode and the aperture stop 26B.

Alternatively, the electron optical system 2B may also be configured to provide an electron beam of the high-resolution mode which is free of a cross-over on the beam path downstream of the electron beam source BS.

Figure 4A:
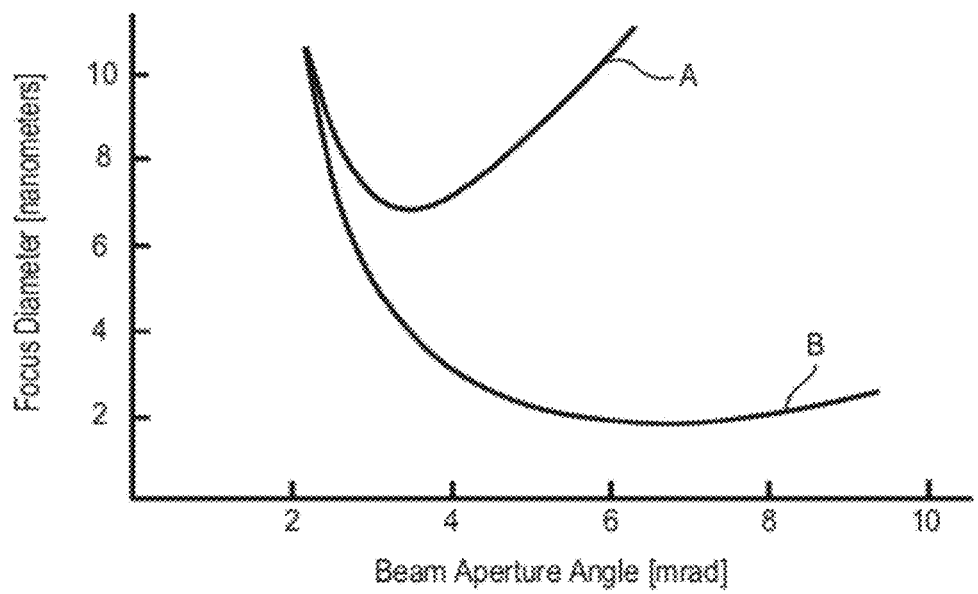
FIG. 4A schematically illustrates the dependency of the focus diameter of an electron beam from the aperture angle of the electron beam.

FIG. 4A illustrates the dependency of the focus diameter of the scanning electron microscope 1, as illustrated in FIG. 1, from the aperture angle of the electron beam in the object plane. Curve A corresponds to the scanning electron microscope 1 having a magnetic objective lens. Curve B corresponds to the scanning electron microscope 1 having an objective lens, which comprises a magnetic and an electrostatic lens. Both curves are measured at a beam energy of 1 keV. These curves demonstrate that obtaining high-resolution images with the scanning electron microscope 1 typically requires an aperture angle $\alpha_1$, which is selected from an optimal range. The optimal range of the aperture angle typically is between 1 mrad and 10 mrad. The optimal range may depend on parameters, such as the beam energy of the particle beam.

Figure 4B:
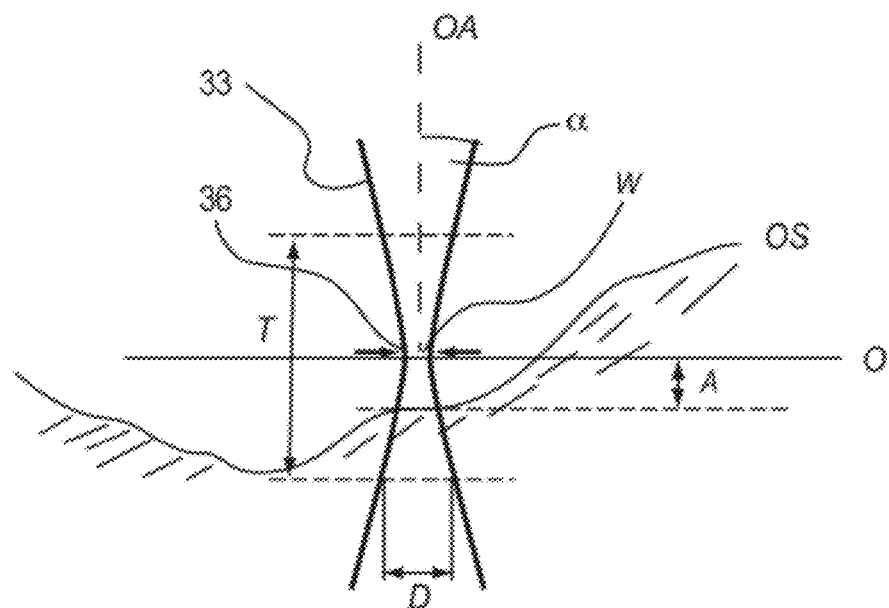
FIG. 4B schematically illustrates how the depth of focus of a particle beam is determined.

FIG. 4B illustrates, how the depth of focus T of an electron beam may be defined. Let D be the diameter of a portion of the object surface, which corresponds to a pixel in an image, which is to be acquired by scanning an electron beam 33 in the object plane O of the electron beam 33. Those portions of the object surface OS, which are scanned with a beam diameter of equal to or less than D appear in focus on the acquired image. In other words, those portions of the object surface OS are imaged in focus, which have a distance A from a beam waist 36 of the electron beam 33 of equal to or less than half of the depth of focus T. On the other hand, portions of the object, which are located at a distance A from the beam waist 36, which exceeds half of the depth of focus T appear out of focus.

Hence, the depth of focus T may be defined as a range along the optical axis OA, in which the diameter of the particle beam 33 is smaller than or equal to D:

$$T = \frac{D}{\tan(\alpha)} \approx \frac{D}{\alpha}, \quad \text{(equation 1)}$$

wherein $\alpha$ denotes an aperture angle of the particle beam 33, as illustrated in FIG. 4B.

Assuming that a high-resolution image of M times M pixels is acquired by scanning a field of view having a rectangular shape of length L. The field of view corresponds to the scanned area on the object surface. By way of example, M has a value of 1,000. Hence, for imaging an object portion in focus, the object portion has to be scanned with an electron beam diameter on the object surface of equal to or less than:

$$D = L/M. \quad \text{(equation 2)}$$

Typically, a maximum height difference h of an object surface amounts to approximately 1/10 of the length of the field of view:

$$h = L/10. \quad \text{(equation 3)}$$

Assuming that for acquiring a three-dimensional representation of the object surface, a scanning of the electron beam of the 3D-mode at N different focus distances is desired. Hence, by using equation 3, a required depth of focus of $$T \leq \frac{L}{10 \cdot N} \quad \text{(equation 4)}$$

results.

Let $\alpha_2$ denote the aperture angle in the 3D-mode and let further $\alpha_1$ denote the aperture angle in the high-resolution mode. Then, a factor k may be defined by:

$$k = \alpha_2/\alpha_1 \quad \text{(equation 5)}$$

By combining equations 1 to 5, we get:

$$k \geq \frac{N \cdot 10}{M \cdot \alpha_1} \quad \text{(equation 7)}$$

By way of example, a three-dimensional representation is generated based on 10 images, which are acquired in the 3D-mode of the microscope. Each of the images is acquired at a different focus distance and has 1,000 times 1,000 pixels. If the aperture angle $\alpha_1$ of the particle beam in the high-resolution mode is 10 mrad, then k has to be equal to or more than 10. In other words, in this example, the aperture angle $\alpha_2$ of the 3D-mode has to be at least 10 times greater than the aperture angle $\alpha_1$ of the high-resolution mode.

Figure 5:
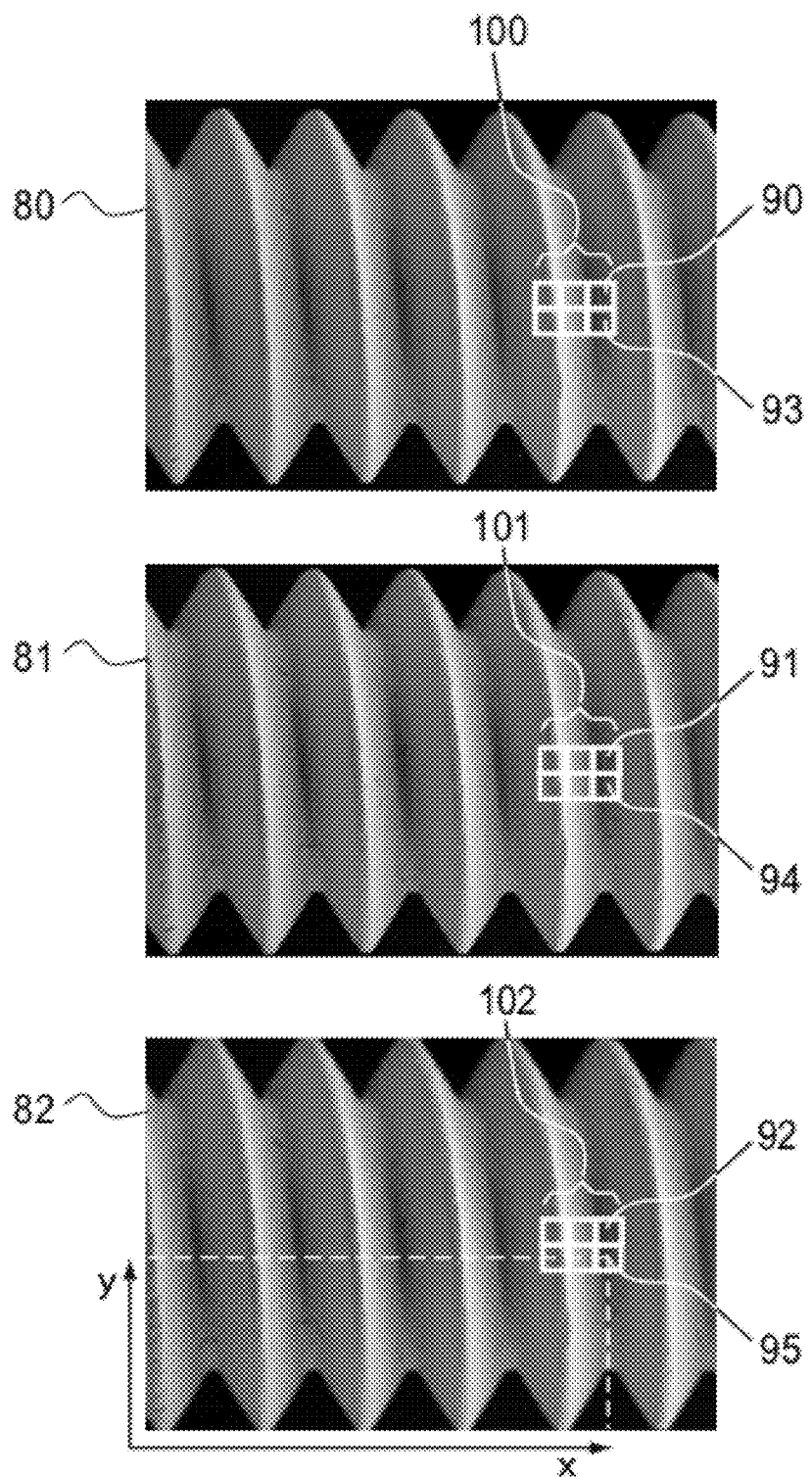
FIG. 5 shows three images acquired in the 3D-mode of the particle optical system, as illustrated in FIGS. 2B and 3B, respectively.

FIG. 5 shows three images 80, 81, 82, which have been acquired with the scanning electron microscope as discussed with reference to FIG. 1. The images have been acquired by laterally scanning the electron beam 32A of the 3D-mode of the electron optical system 2A (as illustrated in FIGS. 2B). The focus distances of the three images are different from each other. In other words, the images 80, and 82 represent images of different objective planes O1, O2, as shown in FIG. 2B.

Each of the images 80, 81, 82 shows substantially a same portion of an object. Depending on the focus distance of the respective image, features of the object, which are located at the focus distance or at a position which deviates from the focus distance by not more than half of the depth of focus of the electron beam 32A of the 3D-mode, appear focused. On the other hand, features, which deviate by more than half of the depth of focus from the focus distance appear unfocused.

The computer 3, as shown in FIG. 1, is configured to match the images 80, 81, 82, by identifying corresponding object features, as they appear in each of the images 80, 81 and 82. By way of example, the computer 3 may apply an edge detection filter to each of the images 80, 81, 82 and then align the images 80, 81, 82 with respect to each other to find the best match between part or all of the detected edges.

The computer 3 is further configured to determine in each of the images 80, 81, 82 a set of regions 100, 101, 102. Each of the set of regions 100, 101, 102 comprises adjacent or substantially adjacent regions. It is also conceivable that the regions are overlapping. For simplicity of illustration, in FIG. 5, only six regions are shown for each of the sets of regions 100, 101, 102. The regions may cover the whole or substantially the whole of the respective image 80, 81, 82. Each of the regions has the form of a square. For example, each of the regions may be a square of 8 times 8 pixels. It is also conceivable that the regions have the form of a rectangle or any other shape. A region may also consist of only one pixel. For simplicity of illustration, in the images 80, 81, 82, the regions are shown enlarged compared with their actual size.

The sets of regions 100, 101, 102 are determined such that each region in an image has corresponding regions in each of the other images. The sets of regions 100, 101, 102 are determined further such that each of the corresponding regions show a common object portion. Corresponding regions, which show the same object portions are referred herein as stack of image regions.

In the exemplary embodiment, which is shown in FIG. 5, the image regions 90, 91 and 92 are corresponding regions, which show a common object portion and which thereby form a stack of image regions. The regions 93, 94 and 95 form a second stack of image regions.

Then, the computer determines an in-focus region from the stack of regions 90, 91, 92 by applying an image processing routine to each of the corresponding regions 90, 91, 92. In the exemplary embodiment, the image processing routine comprises an edge detection filter. Additionally or alternatively, the image processing routine may comprise one or a combination of a high pass filter, and sorting by mean amplitude throughout the stack of image regions. In the exemplary embodiment, region 95 is the in-focus region of the stack of regions 93, 94 and 95 and region 91 is the in-focus region of the stack of regions 90, 91 and 92.

The computer 3 is further configured to determine an x-position and an y-position of each in-focus region. The x-position and y-position may correspond to an x-position and y-position in the object plane. For example, the x-position and y-position correspond to the position of the in-focus region in the image, which has been aligned with the remaining images of the plurality of images 80, 81, 82. In FIG. 5, the x-position and the y-position is indicated at the sides of image 82. The computer 3 is further configured to determine for each in-focus region a z-position which corresponds to the focus distance of the image, which comprises the respective in-focus region. In the exemplary embodiment, the x-positions, y-positions and z-positions of the in-focus regions represent a data set which is the three-dimensional representation of the object surface.

Figure 6:
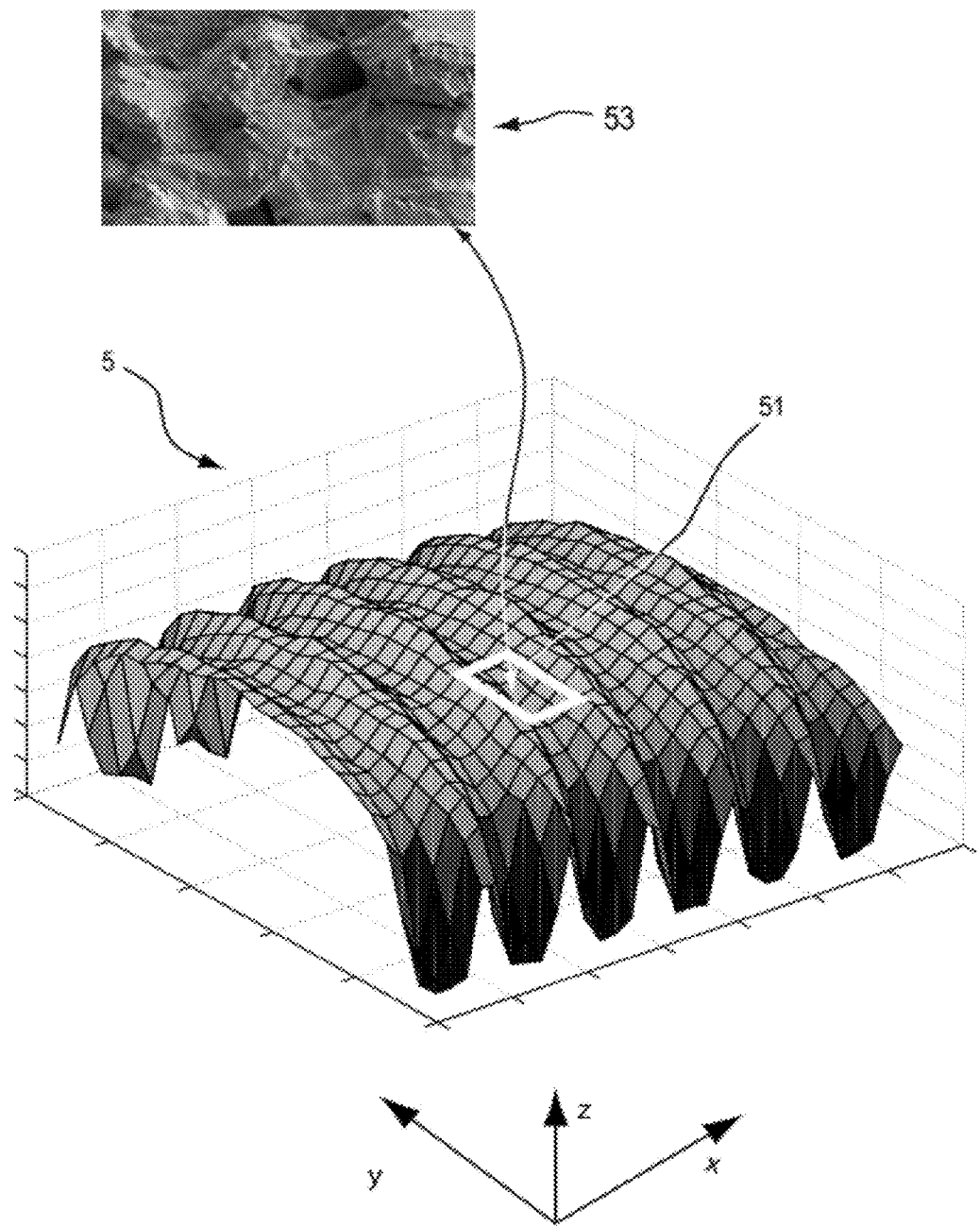
FIG. 6 shows a height profile of a three-dimensional representation, which was generated based on an analysis of the images shown in FIG. 5.

FIG. 6 shows a height profile 5 of the three-dimensional representation, which was generated from a plurality of images, three of which are shown in FIG. 5. The height-profile shows the x-positions, y-positions and z-positions of the in-focus regions. In other words, the height profile is generated from a set of points in space, each point representing the x-position, y-position and z-position of an in-focus region.

The computer 3, as shown in FIG. 1, is configured to store the three-dimensional representation 5 in the computer storage medium 31. The computer 3 is further configured to store a measurement location 51 relative to the three-dimensional representation 5. The measurement location 51 may be a point on the object surface. Alternatively, the measurement location may be a region of the object surface, which has been scanned for obtaining an electron microscopic image 53. The computer 3 may further be configured to mark the measurement locations in the height profile 5 of the three-dimensional representation. Thereby, it is possible for the user to see, which portions of the object surface have already been measured.

In case the object 10 has been moved by the positioning system 15, as shown in FIG. 1, or even removed from the measurement vacuum chamber 12 and later again inserted for further inspection, the stored three-dimensional representation allows to find again the measurement location.

In the exemplary embodiment, the stored three-dimensional representation is compared with a second three-dimensional representation, which has been acquired after the object has been moved, to find again the stored measurement location.

By way of example, the computer 3 may be configured to determine a location of the stored three-dimensional representation relative to the second three-dimensional representation, where a deviation between the stored three-dimensional representation and the acquired three-dimensional representation is minimized. Thereby, it is possible to determine a position of the measurement location relative to the scanning region of the microscope. The determined position of the measurement location relative to the scanning region may be used to position the measurement location 51 in the scanning region by using the positioning system 15.

Accordingly, it is possible to scan a previously scanned measurement location again, after the object has been removed from the measurement position, or even after the object has been removed from the measurement vacuum chamber 12. This allows a more efficient and more detailed inspection of an object surface.

Figure 7B:
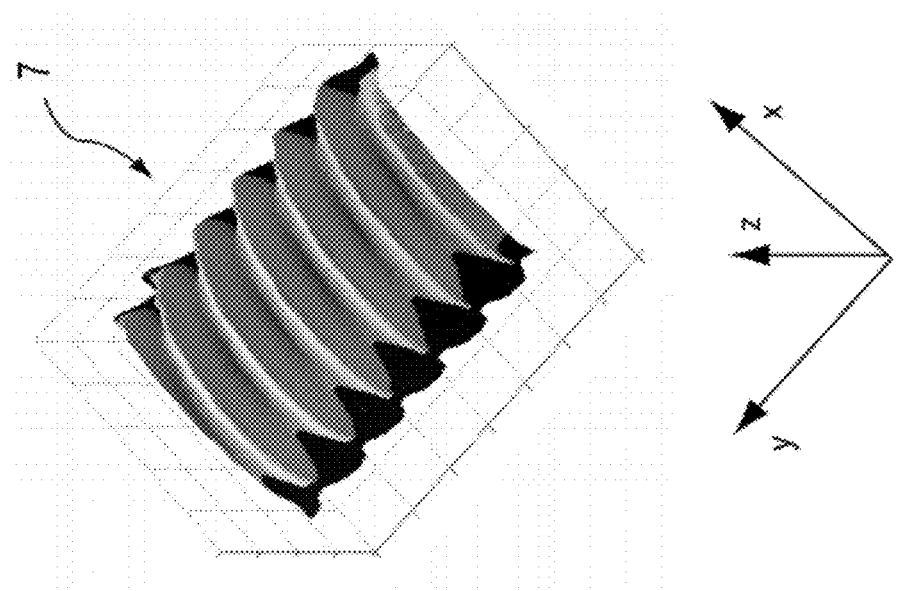
FIGS. 7A and 7B illustrate the projecting of image data values onto the height profile, which is illustrated in FIG. 5.
Figure 7A:
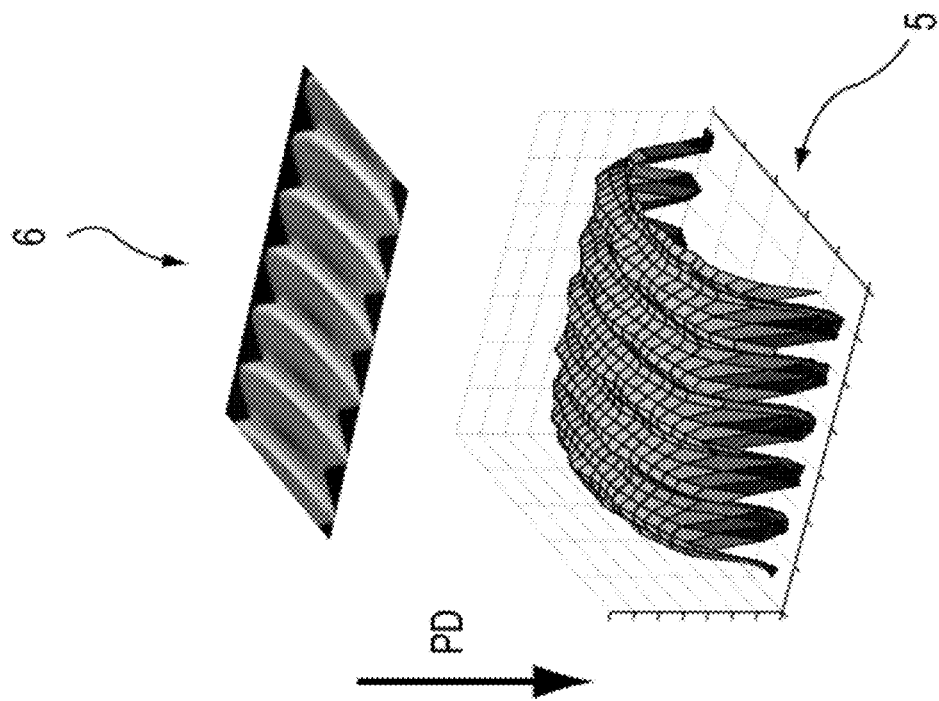

FIG. 7A shows the height-profile 5 of the three-dimensional representation, as has been discussed with reference to FIG. 5. The image 6, which is shown in FIG. 7A, was acquired by the scanning electron microscope 1, as illustrated in FIG. 1. Each pixel of the image 6 represents a data value.

The computer 3, as shown in FIG. 1, is configured to determine for each of the data values of the image 6 a location relative to the three-dimensional representation, wherein the location corresponds to an object portion at which the respective data value is measured. In the example shown in FIG. 7A, the computer identifies for each pixel of the image 6 a location on the surface of the height-profile 5, which corresponds to the object portion, which is represented by the pixel.

The computer 3 is further configured to project the data values of the image 6 onto the height profile 5 such that the data values of the image 6 are located at their corresponding location on the height profile 5. In other words, the data values are projected along a projection direction PD, which corresponds to a direction which represents a direction of the optical axis OA (as shown in FIGS. 2A, 2B, 3A and 3B). The image 6 may be acquired by an electron beam of the 3D-mode and/or an electron beam of the high-resolution mode and/or by an electron beam of a mode which is different from the high-resolution mode and the 3D-mode. Additionally or alternatively, the image data values are taken from the in-focus regions of the plurality of images, which have been acquired in the 3D-mode for generating the height profile 5.

The image data values of the image 6 may depend more on compositional contrast than on topographical contrast. A lateral extent of the scanning region of the image 6 may be smaller than a lateral extent of the scanning region of the electron beam of the 3D-mode for acquiring the three-dimensional representation.

FIG. 7B schematically shows a graphical three-dimensional representation 7, which has been generated by projecting the data values of image 6 onto the height profile 5, as illustrated in FIG. 7a. Accordingly, a realistic, representation of the object surface has been achieved, which may illustrate both topography and chemical composition of the object surface.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

The invention claimed is:

1. A method of inspecting an object using a scanning particle beam microscope, the method comprising:
   operating the microscope in a high-resolution mode by laterally scanning a particle beam of the high-resolution mode;
   operating the microscope in a 3D-mode for acquiring a three-dimensional representation of the object by laterally scanning a particle beam of the 3D-mode;
   wherein a beam energy of the particle beam of the high-resolution mode is equal to a beam energy of the particle beam of the 3D-mode and wherein a focus distance of the particle beam of the high-resolution mode is equal to a focus distance of the particle beam of the 3D-mode; and wherein an aperture angle of the particle beam of the 3D-mode is at least 2 times greater, or at least 5 times greater, or at least 10 times greater, or at least 100 times greater than an aperture angle of the particle beam of the high-resolution mode.

2. The method of claim 1, wherein the aperture angle of the particle beam of the 3D-mode is greater than 2 mrad, or greater than 5 mrad, or greater than 10 mrad, or greater than 100 mrad.

3. The method of claim 1, wherein an object plane of the particle beam of the high-resolution mode is the only plane of the particle beam of the high-resolution mode which is located downstream of a particle beam source and which is optically conjugate to the particle beam source.

4. The method of claim 1, wherein the laterally scanning of the particle beam of the 3D-mode comprises laterally scanning the particle beam of the 3D-mode at each of a plurality of focus distances of the 3D-mode;
wherein the plurality of focus distances comprise the focus distance of the particle beam of the 3D-mode which is equal to the focus distance of the particle beam of the high-resolution mode.

5. The method of claim 4, further comprising:
acquiring a plurality of images, which corresponds to the lateral scanning at the plurality of focus distances;
determining from the plurality of images a plurality of stacks of image regions, such that image regions which are part of a same stack of the plurality of stacks show a same object portion; and
determining for each stack of the plurality of stacks an in-focus region from the image regions of the respective stack.

6. The method of claim 1, further comprising:
determining data values depending on signals generated by a detector of the scanning particle beam microscope; and
determining for each of the data values a location relative to the three-dimensional representation wherein the location corresponds to an object portion at which the respective data value has been measured.

7. The method of claim 1, further comprising:
storing the three-dimensional representation; and
storing a position of a measurement location relative to the three-dimensional representation.

8. The method of claim 7, further comprising:
acquiring a second three-dimensional representation of the object by the operating of the microscope in the 3D-mode; and
comparing the second three-dimensional representation with the stored three-dimensional representation to determine a position of the measurement location relative to a scanning region of the microscope.

9. A method of acquiring a three-dimensional representation of an object by operating a scanning particle beam microscope in a 3D-mode,
wherein in the 3D-mode, an aperture angle of a particle beam of the 3D-mode, which is directed to the object, is at least 2 times greater, or at least 5 times greater, or at least 10 times greater, or at least 100 times greater than an aperture angle of a particle beam of a high-resolution mode of the microscope; and
wherein a beam energy of the particle beam of the high-resolution mode is equal to a beam energy of the particle beam of the 3D-mode, and wherein a focus distance of the particle beam of the high-resolution mode is equal to a focus distance of the particle beam of the 3D-mode.

10. A scanning particle beam microscope having a particle optical system,
wherein the particle optical system is configured to be operable in a high-resolution mode by laterally scanning a particle beam of the high-resolution mode;
wherein the particle beam microscope is further configured to be operable in a 3D-mode for acquiring a three-dimensional representation of an object by laterally scanning a particle beam of the 3D-mode;
wherein a beam energy of the particle beam of the high-resolution mode is equal to a beam energy of the particle beam of the 3D-mode and wherein a focus distance of the particle beam of the high-resolution mode is equal to a focus distance of the particle beam of the 3D-mode; and
wherein an aperture angle of the particle beam of the 3D-mode is at least 2 times greater, or at least 5 times greater, or at least 10 times greater, or at least 100 times greater than an aperture angle of the particle beam of the high-resolution mode.

11. The scanning particle beam microscope of claim 10, wherein the aperture angle of the particle beam of the 3D-mode is greater than 2 mrad, or greater than 5 mrad, or greater than 10 mrad, or greater than 100 mrad.

12. The scanning particle beam microscope of claim 10, wherein the particle optical system further comprises a particle beam source, wherein an object plane of the particle beam of the high-resolution mode is the only plane of the particle beam of the high-resolution mode, which is located downstream of the particle beam source and which is optically conjugate to the particle beam source.

13. The scanning particle beam microscope of claim 10, wherein the particle optical system further comprises:
a first magnetic condenser lens having a principal plane; and
an objective lens having a principal plane.

14. The scanning particle beam microscope of claim 13, wherein the particle optical system is configured such that an excitation of the first magnetic condenser lens in the 3D-mode is higher than an excitation of the first magnetic condenser lens in the high-resolution mode.

15. The scanning particle beam microscope of claim 13, wherein the particle optical system is configured such that the particle beam of the 3D-mode comprises a cross-over on the beam path between the principal plane of the first magnetic condenser lens and the principal plane of the objective lens.

16. The scanning particle beam microscope of claim 15, wherein the particle optical system is configured such that the particle beam of the high-resolution mode comprises a cross-over on the beam path between the principal plane of the first magnetic condenser lens and the principal plane of the objective lens;
wherein the particle optical system comprises an aperture stop arranged between the principal plane of the first magnetic condenser lens and the principal plane of the objective lens in the beam path; and
wherein a distance along the optical axis between the aperture stop and the cross-over of the particle beam of the high-resolution mode is greater than a distance along the optical axis between the aperture stop and the cross-over of the particle beam of the 3D-mode.

17. The scanning particle beam microscope of claim 13, wherein the particle optical system further comprises a second magnetic condenser lens which is arranged between the first magnetic condenser lens and the objective lens in the beam path;

wherein an excitation of the first magnetic condenser lens in the 3D-mode is lower than an excitation of the first magnetic condenser lens in the high-resolution mode; and wherein an excitation of the second magnetic condenser lens in the 3D-mode is higher than an excitation of the second magnetic condenser lens in the high-resolution mode.

18. The scanning particle beam microscope of claim 10, wherein the aperture stop is configured to provide a plurality of different aperture diameters at a position in the beam path;

wherein an aperture diameter for the particle beam of the high-resolution mode is smaller than an aperture diameter for the particle beam of the 3D-mode.

19. The scanning particle beam microscope of claim 10, wherein the particle optical system is configured such that the laterally scanning of the particle beam of the 3D-mode comprises laterally scanning the particle beam of the 3D-mode at each of a plurality of focus distances of the 3D-mode;

wherein the plurality of focus distances comprise the focus distance of the particle beam of the 3D-mode which is equal to the focus distance of the particle beam of the high-resolution mode.

20. The scanning particle beam microscope of claim 19, further comprising:

a detector which is configured to detect particles during the laterally scanning of the particle beam of the 3D-mode and to generate signals depending on the detected particles; and a computer which is configured to receive the signals of the detector, wherein the computer is configured to generate a plurality of images depending on the signals of the detector, wherein the plurality of images correspond to the plurality of focus distances;

determine from the plurality of images a plurality of stacks of image regions, such that image regions which are part of a same stack of the plurality of stacks show a same object portion; and to determine for each stack of the plurality of stacks an in-focus region from the image regions of the respective stack.

21. The scanning particle beam microscope of claim 10, further comprising a computer storage medium which is configured to store the three-dimensional representation and to store a position of a measurement location relative to the three-dimensional representation.

22. The scanning particle beam microscope of claim 21, wherein the computer is further configured to compare a second three-dimensional representation acquired in the 3D-mode with the stored three-dimensional representation to determine a position of the measurement location relative to a scanning region of the scanning particle beam microscope.

* * * * *